(12) United States Patent
Yoon

(10) Patent No.: US 10,083,090 B2
(45) Date of Patent: Sep. 25, 2018

(54) NONVOLATILE DUAL IN-LINE MEMORY MODULE AND METHOD FOR OPERATING THE SAME

(71) Applicant: SK hynix Inc., Gyeonggi-do (KR)

(72) Inventor: HyunJu Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 163 days.

(21) Appl. No.: 15/244,849

(22) Filed: Aug. 23, 2016

(65) Prior Publication Data

US 2017/0277594 A1   Sep. 28, 2017

(30) Foreign Application Priority Data

Mar. 28, 2016 (KR) .................. 10-2016-0036644

(51) Int. Cl.
| | |
|---|---|
| G06F 11/00 | (2006.01) |
| G06F 11/14 | (2006.01) |
| G06F 3/06 | (2006.01) |
| G11C 11/406 | (2006.01) |
| G06F 13/40 | (2006.01) |

(52) U.S. Cl.
CPC ........ G06F 11/1451 (2013.01); G06F 3/0611 (2013.01); G06F 3/0619 (2013.01); G06F 3/0647 (2013.01); G06F 3/0653 (2013.01); G06F 3/0685 (2013.01); G06F 11/1469 (2013.01); G06F 13/4068 (2013.01); G11C 11/406 (2013.01); G06F 2201/805 (2013.01); G06F 2201/82 (2013.01)

(58) Field of Classification Search
CPC ............. G06F 11/1451; G06F 11/1469; G06F 11/1448
See application file for complete search history.

(56) References Cited

U.S. PATENT DOCUMENTS

| | | | |
|---|---|---|---|
| 7,865,679 B2 | 1/2011 | Sartore | |
| 8,874,831 B2 | 10/2014 | Lee et al. | |
| 9,471,517 B1* | 10/2016 | Yoon | .................. G06F 13/161 |
| 2012/0089796 A1* | 4/2012 | Fukazawa | ........... G06F 11/1441 711/162 |
| 2013/0028039 A1* | 1/2013 | Wang | .................. G11C 11/4072 365/226 |
| 2016/0306756 A1* | 10/2016 | Yoon | .................. G06F 13/161 |

* cited by examiner

*Primary Examiner* — Charles Ehne
(74) *Attorney, Agent, or Firm* — IP & T Group LLP

(57) ABSTRACT

A nonvolatile memory module includes a plurality of volatile memory devices sharing a data bus through which data is transmitted and a control bus through which a command and an address are transmitted; at least one nonvolatile memory device; and a controller including a backup logic which backs up data stored in the plurality of volatile memory devices when a fail in power of the host is detected or a backup operation is instructed from the memory controller of the host, wherein the backup logic sets a command address latency (CAL) of one among the plurality of volatile memory devices to a first value, and sets a command address latency of remaining volatile memory devices to a second value different from the first value.

16 Claims, 12 Drawing Sheets

(RELATED ART)　　　(RELATED ART)

NONVOLATILE DUAL IN-LINE MEMORY MODULE AND METHOD FOR OPERATING THE SAME

CROSS-REFERENCE TO RELATED APPLICATION

This application claims priority under 35 U.S.C. § 119 to Korean Patent Application No. 10-2016-0036644 filed on Mar. 28, 2016, the disclosure of which is herein incorporated by reference in its entirety.

TECHNICAL FIELD

Exemplary embodiments relate to a semiconductor memory technology, and more particularly, to a nonvolatile dual in-line memory module capable of independently accessing volatile memory devices therein with a reduced number of signal lines, and a method for operating the same.

DISCUSSION OF THE RELATED ART

In most cases, a single controller is coupled to and controls two or more memory devices.

As shown in FIG. 1A, when a control bus CMD/ADDR_BUS0 for a command and an address and a data bus DATA_BUS0 between a controller 100 and a memory device 110_0 are separated from a control bus CMD/ADDR_BUS1 and a data bus DATA_BUS1 between the controller 100 and a memory device 110_1, the controller 100 may independently control the memory device 110_0 and the memory device 110_1. For example, while a read operation is performed in the memory device 110_0, a write operation may be performed in the memory device 110_1.

As shown in FIG. 1B, when a control bus CMD/ADDR_BUS and a data bus DATA_BUS are shared by a plurality of memory devices 110_0 and 110_1, signal lines for chip select signals CS0 and CS1 are separately provided. That is, the signal lines for the chip select signals CS0 and CS1 are separately provided for the respective memory devices 110_0 and 110_1. Therefore, a memory device selected by the chip select signal CS0 or CS1 between the memory devices 110_0 and 110_1 may perform an operation instructed through the control bus CMD/ADDR_BUS, and may exchange signals with the controller 100 through the shared data bus DATA_BUS.

As the number of memory devices coupled to the single controller increases, the number of required signal lines increases, which increases difficulty in system design and increases the fabrication cost.

SUMMARY

Various embodiments are directed to a nonvolatile dual in-line memory system, a memory module and a method for operating the memory module, wherein, when performing a backup/restoration operation in a nonvolatile dual in-line memory module by the power fail/recovery of a host, the backup/restoration operation is performed by individually accessing volatile memory devices while reducing the number of wiring lines of a data bus in the memory module.

In an embodiment, a nonvolatile memory module may include: a plurality of volatile memory devices sharing a data bus through which data is transmitted and a control bus through which a command and an address are transmitted; at least one nonvolatile memory device; and a controller including a backup logic which backs up data stored in the plurality of volatile memory devices when a fail in power of the host is detected or a backup operation is instructed from the memory controller of the host, wherein the backup logic sets a command address latency (CAL) of one among the plurality of volatile memory devices to a first value, and sets a command address latency of remaining volatile memory devices to a second value different from the first value.

The second value may be greater than the first value, and a difference between the second value and the first value may be equal to or greater than a row address to column address delay time (tRCD: RAS to CAS delay).

The difference between the second value and the first value may be less than a row precharge time (tRP).

The backup logic includes a logic suitable for performing a distributed refresh operation for uniformly distributing a refresh cycle over the plurality of volatile memory devices when programming a memory page of the nonvolatile memory device; a logic suitable for operating the plurality of volatile memory devices under a low power mode, in which the plurality of volatile memory devices use a lower power than in a normal power mode, when a new memory page of the nonvolatile memory device is prepared and written; and a logic suitable for recovering the plurality of volatile memory devices to the normal power mode after the new memory page of the nonvolatile memory device is written.

The controller may further include a restoration logic suitable for restoring data backed up in the nonvolatile memory device to the plurality of volatile memory devices when the power of the host is recovered to a normal state, and the restoration logic sets a command address latency (CAL) of one among the plurality of volatile memory devices to a third value, and sets a command address latency of remaining volatile memory devices to a fourth value different from the third value.

The fourth value may be greater than the third value, and a difference between the fourth value and the third value may be equal to or greater than a row address to column address delay time (tRCD: RAS to CAS delay).

The difference between the fourth value and the third value may be less than a row precharge time (tRP).

The restoration logic may include a logic suitable for determining whether a sufficient amount of erased blocks for data backup exist in the nonvolatile memory device, after data restoration from the nonvolatile memory device to the plurality of volatile memory devices is completed; a logic suitable for erasing a new block when the sufficient amount of erased bocks for data backup do not exist in the nonvolatile memory device; and a logic suitable for changing control over the plurality of volatile memory devices from the controller to the memory controller of the host, when the sufficient amount of erased backs for data backup exist in the nonvolatile memory device.

In an embodiment, A method for operating a nonvolatile memory module including a plurality of volatile memory devices which share a data bus through which data is transmitted and a control bus through which a command and an address are transmitted, a nonvolatile memory device, and a controller may include: controlling, by a memory controller of a host, the plurality of volatile memory devices; detecting a fail in power of the host or receiving an instruction for a backup operation from the memory controller of the host; changing control over the plurality of volatile memory devices from the memory controller of the host to the controller; setting, by the controller, a command address latency (CAL) of one among the plurality of volatile memory devices to a first value, and setting, by the controller, a command address latency of remaining volatile memory devices to a second value different from the first value; reading the volatile memory device of the command address latency of the first value; and backing up the read data in the nonvolatile memory device.

The second value may be greater than the first value, and a difference between the second value and the first value may be equal to or greater than a row address to column address delay time (tRCD: RAS to CAS delay).

The difference between the second value and the first value may be less than a row precharge time (tRP).

The backing up of the read data may include performing a distributed refresh operation for uniformly distributing a refresh cycle over the plurality of volatile memory devices when programming a memory page of the nonvolatile memory device; operating the plurality of volatile memory devices under a low power mode, in which the plurality of volatile memory devices use a lower power than in a normal power mode, when a new memory page of the nonvolatile memory device is prepared and written; and recovering the plurality of volatile memory devices to the normal power mode after the new memory page of the nonvolatile memory device is written.

The method may further include, detecting a recovery in the power of the host or receiving an instruction for a restoration operation from the memory controller of the host; setting, by the controller, a command address latency (CAL) of one among the plurality of volatile memory devices to a third value, and setting, by the controller, a command address latency of remaining volatile memory devices to a fourth value different from the third value; reading data backed up in the nonvolatile memory device, and restoring the read data in the volatile memory device of the command address latency of the third value; and iterating the setting of the CAL to the third and fourth values and the reading and restoring when data to be restored remains in the nonvolatile memory device.

The fourth value may be greater than the third value, and a difference between the fourth value and the third value may be equal to or greater than a row address to column address delay time (tRCD: RAS to CAS delay).

The difference between the fourth value and the third value may be less than a row precharge time (tRP).

The method may further include, determining whether a sufficient amount of erased blocks for data backup exist in the nonvolatile memory device; (vii) erasing a new block when the sufficient amount of erased bocks for data backup do not exist in the nonvolatile memory device; and (viii) changing control over the plurality of volatile memory devices from the controller to the memory controller of the host, when the sufficient amount of erased bocks for data backup exist in the nonvolatile memory device.

A nonvolatile memory module may include: volatile memory devices suitable for storing data provided from a host through a common data bus; a nonvolatile memory device suitable for backup of data stored in the volatile memory devices; and a controller suitable for backing up data of the selected volatile memory devices in the nonvolatile memory device, upon a power failure of the host, wherein the controller sets a command address latency (CAL) of a selected one of the volatile memory devices to a first value, and sets a command address latency of remaining ones of the volatile memory devices to a second value, in the backing up the data.

According to embodiments of the present invention, when performing a backup/restoration operation in a nonvolatile dual in-line memory module due to the power fail/recovery of a host, it is possible to perform the backup/restoration operation by individually accessing volatile memory devices with a reduced number of signal lines of a data bus in the nonvolatile dual in-line memory module.

DETAILED DESCRIPTION

Figure 1A:
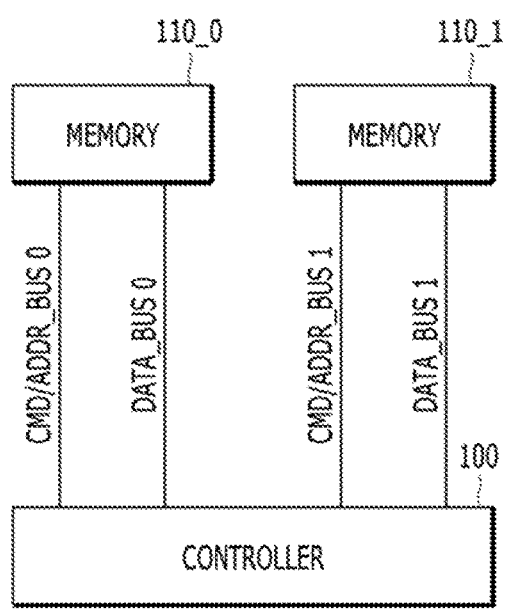
FIGS. 1A and 1B are a block diagram illustrating examples of bus connections between a controller and a memory device according to the conventional art.
Figure 1B:
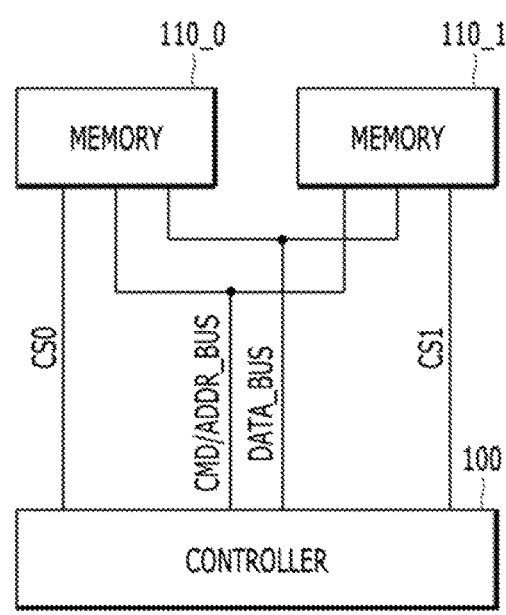

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present disclosure relates to a nonvolatile dual in-line memory module in which a controller may independently access volatile memory devices sharing a data bus and a control bus with a reduced number of signal lines. Hereafter, to facilitate understanding of a nonvolatile dual in-line memory module in accordance with an embodiment, descriptions will be made sequentially from detailed configurations of the entire system.

Per-Dram Addressability (PDA) Mode of Volatile Memory Device

First, descriptions will be made for the PDA mode and the command address latency (CAL) of a volatile memory device.

Figure 2:
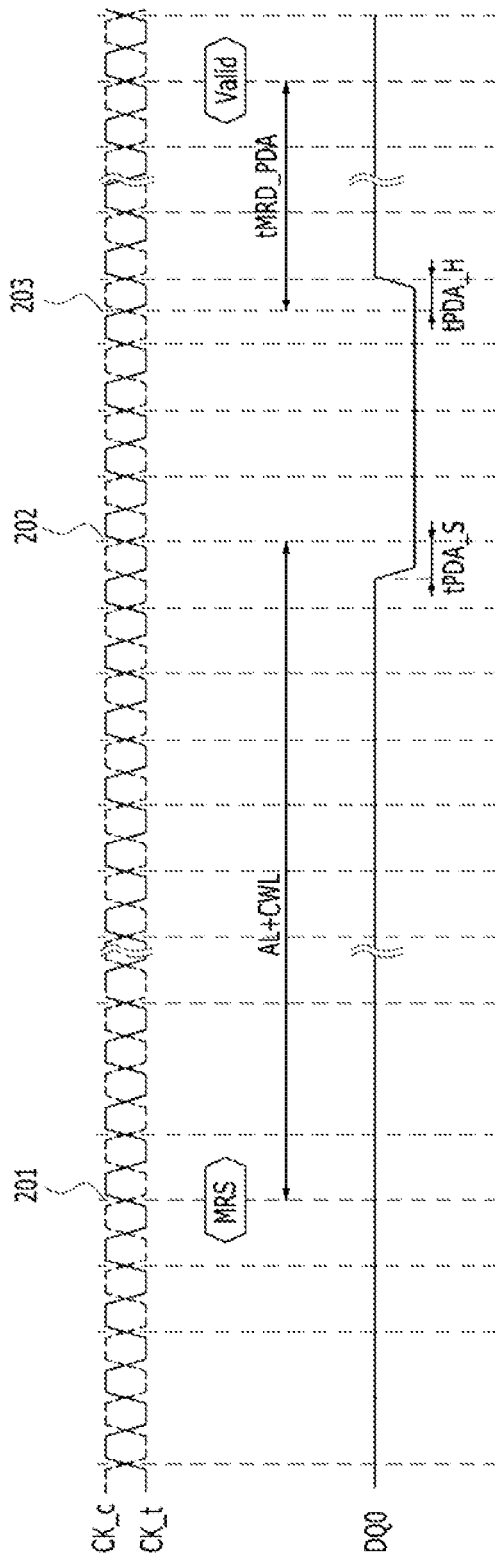
FIG. 2 is an example of a timing diagram to assist in the description of the operation of a mode register set (MRS) under a PDA mode in a volatile memory device.

FIG. 2 is an example of a timing diagram to assist in the description of the operation of a mode register set (MRS) under a PDA mode in a volatile memory device.

In the PDA mode, an independent mode register set operation is performed for each volatile memory device. When the PDA mode is set, validity of all mode register set commands may be determined according to the signal level of a zeroth data pad DQ0. If the signal level of the zeroth data pad DQ0 is '0' after a write latency (WL=AL+CWL where WL denotes write latency, AL denotes additive latency and CWL denotes CAS write latency), all mode register set commands applied may be determined as valid, and, if the signal level of the zeroth data pad DQ0 is '1,' all mode register set commands applied may be determined as invalid and may be neglected.

Referring to FIG. 2, at a point of time 201, a mode register set command MRS is applied to a volatile memory device. At a point of time 202 when a time corresponding to a write latency (WL=AL+CWL) passes from the point of time 201, the signal level of the zeroth data pad DQ0 transitions to '0' to be retained for a predetermined period. Therefore, the mode register set command MRS applied at the point of time 201 is determined as valid, and the setting operation of the volatile memory device by using an address (not shown) inputted together with the mode register set command MRS is performed during a mode register set command cycle time (denoted as "tMRD_PDA" in FIG. 2) from a point of time 203.

When the signal level of the zeroth data pad DQ0 is continuously retained as '1' at the point of time 202, the mode register set command MRS applied at the point of time 201 is determined as invalid and is thus neglected. That is, the setting operation of the volatile memory device is not performed.

Command Address Latency (CAL) of Volatile Memory Device

Figure 3:
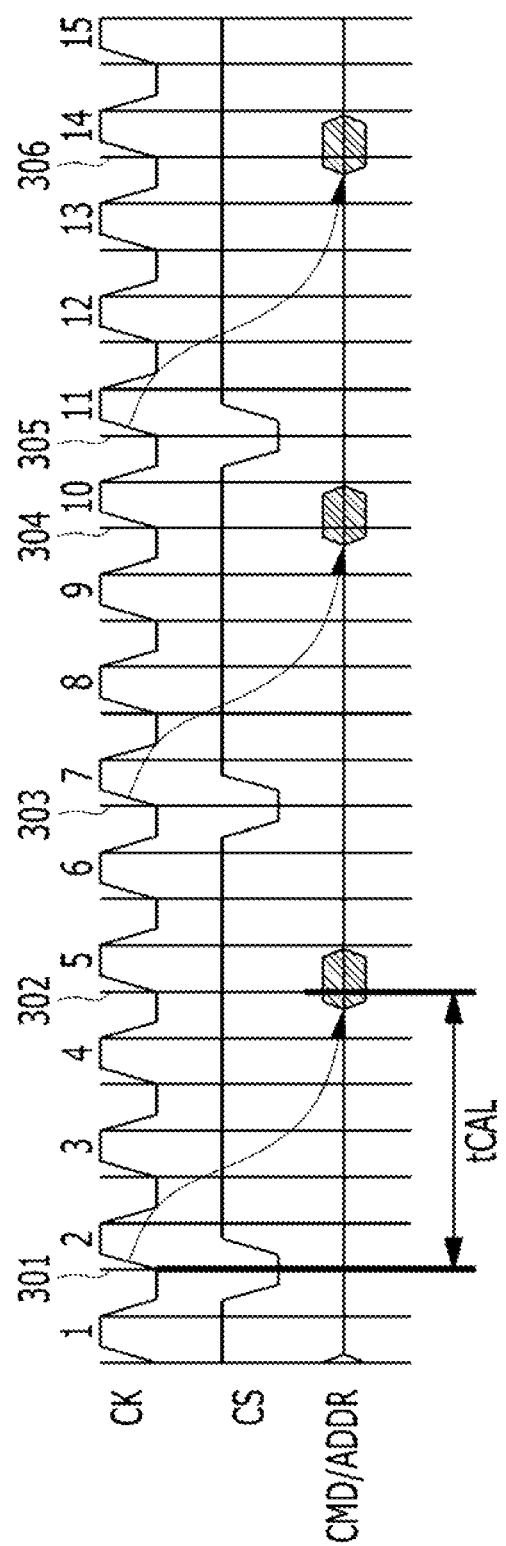
FIG. 3 is an example of a timing diagram to assist in the description of the command address latency (CAL) of a volatile memory device.

FIG. 3 is an example of a timing diagram to assist in the description of the CAL of a volatile memory device.

A CAL indicates the timing difference between a chip select signal CS and the remaining signals among control signals transferred through a control bus (CMD/ADDR_BUS). If the CAL is set, a volatile memory device determines as valid only the control signals inputted after a time corresponding to the CAL passes from the enable time of the chip select signal CS. The value of the CAL may be set by a mode register set (MRS).

FIG. 3 shows an operation when the CAL is set to 3 clock cycles. At a point of time 302 when 3 clocks pass after a point of time 301 when the chip select signal CS is enabled to a low level, a command CMD other than the chip select signal CS) and an address ADDR are applied to the volatile memory device. Then, the volatile memory device may recognize as valid the command CMD and the address ADDR applied at the point of time 302. When the command CMD and the address ADDR are applied to the volatile memory device at the same point of time as the point of time 301 when the chip select signal CS is enabled or at a point of time when 1 clock or 2 clocks pass from the point of time 301 when the chip select signal CS is enabled, the volatile memory device does not recognize the command CMD and the address ADDR as valid.

Since the command CMD and the address ADDR are also applied at points of time 304 and 306 when a time corresponding to the CAL for example, 3 clocks, passes from points of time 303 and 305 when the chip select signal CS is enabled, the command CMD and the address ADDR applied at the points of time 304 and 306 may be recognized as valid by the volatile memory device.

Basic Configuration of Dual in-Line Memory Module (DIMM)

Figure 4:
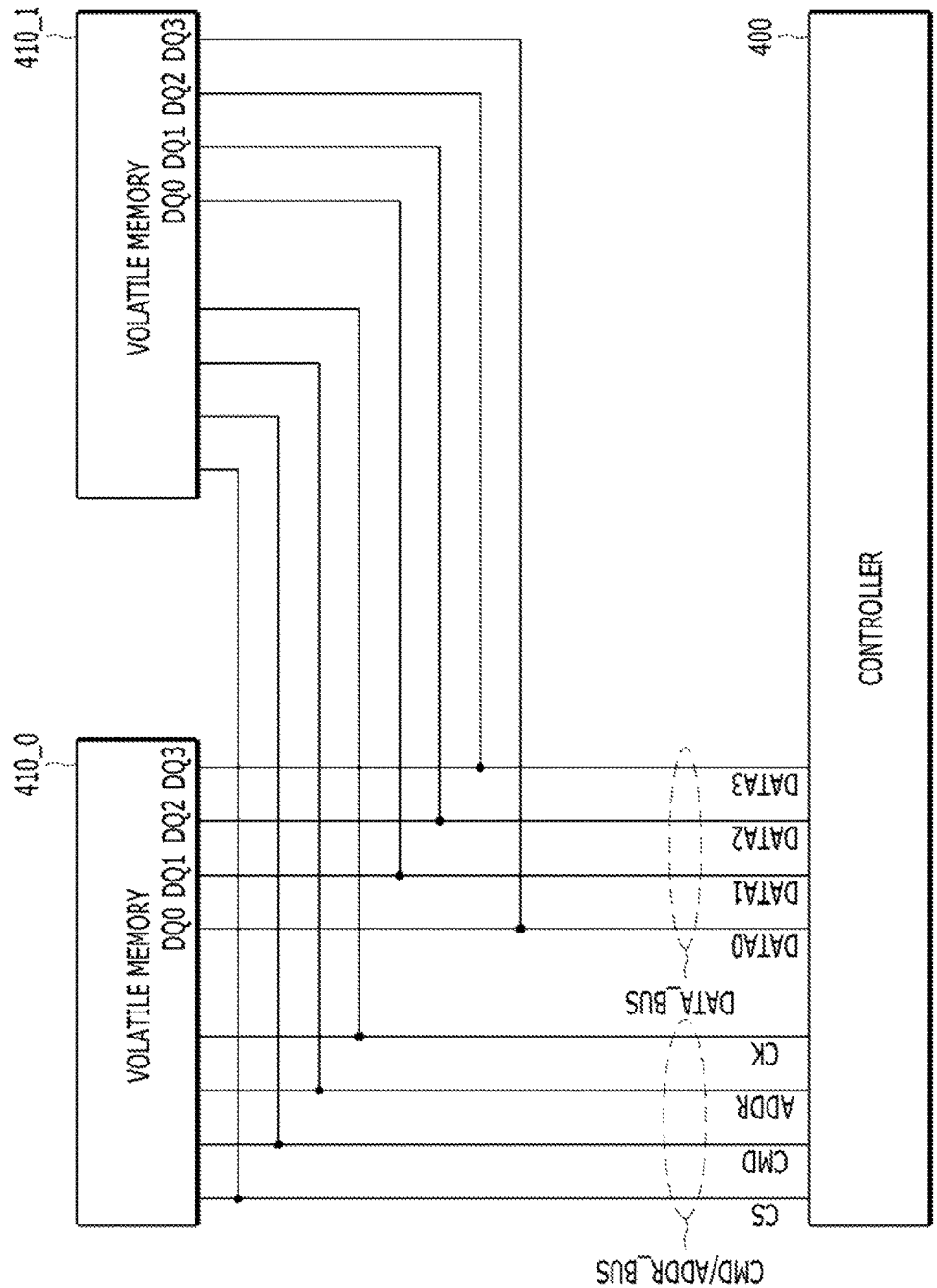
FIG. 4 is a block diagram illustrating a basic configuration of a dual in-line memory module (DIMM) in accordance with an embodiment.

FIG. 4 is a block diagram illustrating a basic configuration of a DIMM in accordance with an embodiment.

Referring to FIG. 4, the DIMM may include a controller 400, a first volatile memory device 410_0, a second volatile memory device 410_1, a control bus CMD/ADDR_BUS, and a data bus DATA_BUS.

Control signals are transferred from the controller 400 to the volatile memory devices 410_0 and 410_1 through the control bus CMD/ADDR_BUS. The control signals may include a command CMD, an address ADDR and a clock CK. The command CMD may include a plurality of signals. For example, the command CMD may include an active signal (ACT), a row address strobe signal (RAS), a column address strobe signal (CAS) and a chip select signal (CS). Although the chip select signal CS is a signal which is included in the command CMD, the chip select signal CS is separately shown in the drawing to represent that the volatile memory devices 410_0 and 410_1 share the same chip select signal CS. The address ADDR may include a plurality of signals. For example, the address ADDR may include a multi-bit bank group address, a multi-bit bank address and a multi-bit normal address. The clock CK may be transferred from the controller 400 to the volatile memory devices 410_0 and 410_1 for synchronized operations of the volatile memory devices 410_0 and 410_1. The clock CK may be transferred in a differential scheme including a clock (CK_t) and a clock bar (CK_c) acquired by inverting the clock (CK_t).

The data bus DATA_BUS may transfer multi-bit data DATA0 to DATA3 between the controller 400 and the volatile memory devices 410_0 and 410_1. The respective volatile memory devices 410_0 and 410_1 are provided with data pads DQ0 to DQ3 respectively coupled with data lines DATA0 to DATA3 of the data bus DATA_BUS. A particular data pad for example, data pad DQ0 of the respective volatile memory devices 410_0 and 410_1 may be coupled to different data lines DATA0 and DATA1. The specified data pads DQ0 may be used to set latencies for recognizing the control signals on the control bus CMD/ADDR_BUS.

The controller 400 may control the volatile memory devices 410_0 and 410_1 through the control bus CMD/ADDR_BUS, and may exchange data with the volatile memory devices 410_0 and 410_1 through the data bus DATA_BUS. The controller 400 may be provided in the DIMM, may set latencies to different values for allowing the volatile memory devices 410_0 and 410_1 to recognize signals on the control bus CMD/ADDR_BUS, and may access a volatile memory device desired between the volatile memory devices 410_0 and 410_1, by using the latencies. This will be described below in detail with reference to FIGS. 5 to 7B.

The first volatile memory device 410_0 and the second volatile memory device 410_1 may share the control bus CMD/ADDR_BUS and the data bus DATA_BUS. The first volatile memory device 410_0 and the second volatile memory device 410_1 may also share the chip select signal CS. The first volatile memory device 410_0 and the second volatile memory device 410_1 may be set with different latencies for control signals to be transmitted through the control bus CMD/ADDR_BUS. A latency may mean the timing difference between a reference signal for example, the chip select signal CS and the remaining signals CMD and ADDR among signals on the control bus CMD/AD- DR_BUS. Due to the fact that the first volatile memory device 410_0 and the second volatile memory device 410_1 are set with different latencies with respect to the control bus CMD/ADDR_BUS, the first volatile memory device 410_0 and the second volatile memory device 410_1 may be independently accessed by the controller 400, which will be described below in detail with reference to FIGS. 5 to 7B.

As may be seen from FIG. 4, any signal transmission lines for identifying the first volatile memory device 410_0 and the second volatile memory device 410_1 are not separately allocated to the first volatile memory device 410_0 and the second volatile memory device 410_1. Nevertheless, the controller 400 may separately access the first volatile memory device 410_0 and the second volatile memory device 410_1, which will be described below.

Basic CAL Setting Operation of DIMM

Figure 5:
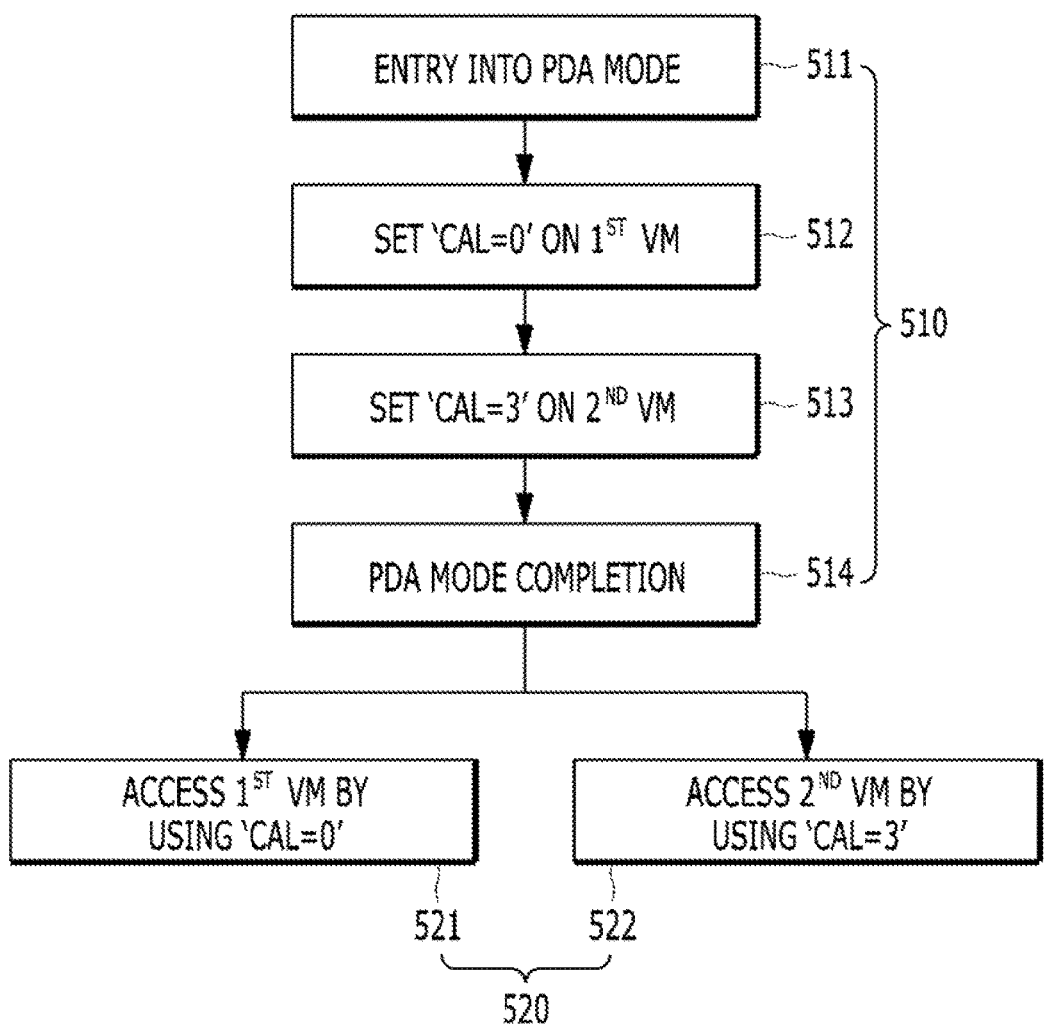
FIG. 5 is an example of a flow chart to assist in the description of operations of the DIMM shown in FIG. 4.

FIG. 5 is an example of a flow chart to assist in the description of operations of the DIMM shown in FIG. 4.

Referring to FIG. 5, operations of the DIMM may be divided into step 510 for the controller 400 to set different latencies for control signals transmitted through the control bus CMD/ADDR_BUS of the first volatile memory device 410_0 and the second volatile memory device 410_1, and step 520 for the controller 400 to separately access the first volatile memory device 410_0 and the second volatile memory device 410_1.

At step 511, the controller 400 may control the first volatile memory device 410_0 and the second volatile memory device 410_1 to enter a PDA mode. This may be implemented by applying the command CMD corresponding to a mode register set command (MRS) and applying the address ADDR as a combination corresponding to entry to the PDA mode.

Figure 6:
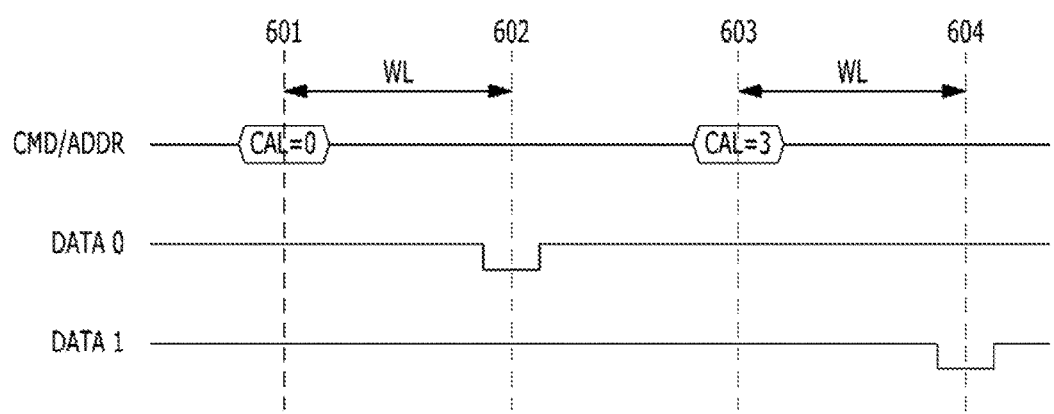
FIG. 6 is an example of a timing diagram to assist in the description of operations 512 and 513 of FIG. 5.

At step 512, the command address latency CAL of the first volatile memory device 410_0 may be set to '0'. This may be implemented by applying the command CMD as the combination corresponding to the mode register set command (MRS) and applying the address ADDR as a combination corresponding to setting of the CAL to '0' and applying the signal level of '0' to the zeroth data line DATA0 corresponding to the zeroth data pad DQ0 of the first volatile memory device 410_0 after a write latency WL (WL=AL+CWL) passes from the application time of the command CMD. Referring to FIG. 6, the command/address CMD/ADDR for setting the CAL to '0' are applied at a point of time 601 and the data line DATA0 has the level of '0' at a point of time 602 when a time corresponding to the write latency WL passes from the point of time 601. Since the data line DATA1 has the level of '1' at the point of time 602, the second volatile memory device 410_1 neglects the command CMD applied at the point of time 601.

At step 513, the command address latency CAL of the second volatile memory device 410_1 may be set to '3'. This may be implemented by applying the command CMD as the combination corresponding to the mode register set command (MRS) and applying the address ADDR as a combination corresponding to setting of the CAL to '3' and applying the signal level of '0' to the first data line DATA1 corresponding to the zeroth data pad DQ0 of the second volatile memory device 410_1 after the write latency WL (WL=AL+CWL) passes from the application time of the command CMD. Referring to FIG. 6, the command/address CMD/ADDR for setting the CAL to '3' are applied at a point of time 603 and the data line DATA1 has the level of '0' at a point of time 604 when a time corresponding to the write latency WL passes from the point of time 603. Since the data line DATA0 has the level of '1' at the point of time 604, the first volatile memory device 410_0 neglects the command CMD applied at the point of time 603. When the latency setting of the volatile memory devices 410_0 and 410_1 is completed, the PDA mode may be ended at step 514.

Since the command address latencies CAL of the first volatile memory device 410_0 and the second volatile memory device 410_1 are set differently from each other, the controller 400 may access the first volatile memory device 410_0 by applying the command/address CMD/ADDR at the enable time of the chip select signal CS at step 521 or may access the second volatile memory device 410_1 by applying the command/address CMD/ADDR after 3 clocks from the enable time of the chip select signal CS at step 522.

Figure 7A:
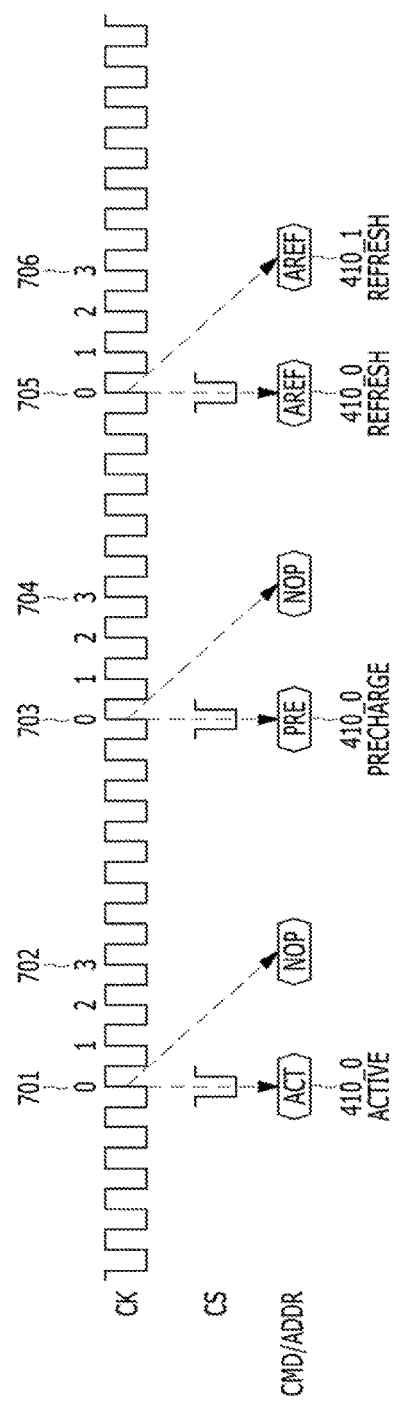
FIGS. 7A and 7B are examples of a timing diagram to assist in the description of operations 521 and 522 of FIG. 5.
Figure 7B:
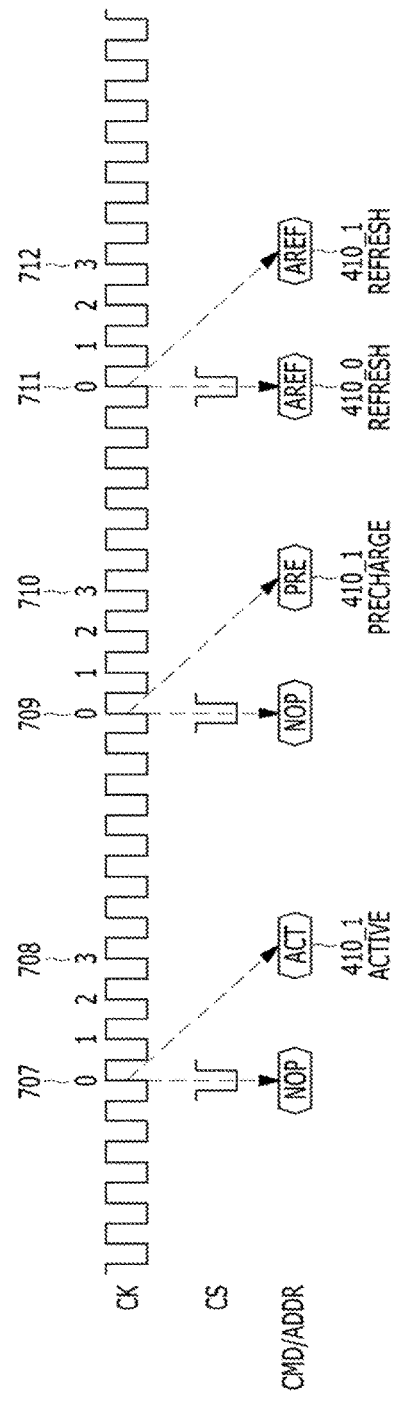

FIGS. 7A and 7B are timing diagrams representing the operations 521 and 522 of FIG. 5. Referring to FIG. 7A and FIG. 7B, the commands CMD applied at the same points of time 701, 703, 705, 707, 709 and 711 as the enable times of the chip select signal CS are recognized by the first volatile memory device 410_0 and operate the first volatile memory device 410_0, and the commands CMD applied at points of time 702, 704, 706, 708, 710 and 712 after 3 clocks from the enable times of the chip select signal CS are recognized by the second volatile memory device 410_1 and operate the second volatile memory device 410_1. In the drawing, the reference symbol NOP represents a non-operation state in which an operation is not performed.

In the operations at the points of time 701, 702, 703, 704, 707, 708, 709 and 710, it is possible to access only one volatile memory device of the first volatile memory device 410_0 and the second volatile memory device 410_1. Further, in the operations at the points of time 705, 706, 711 and 712, it may be possible to access both the first volatile memory device 410_0 and the second volatile memory device 410_1 by applying the valid command CMD at the enable times of the chip select signal CS as well as applying the valid command CMD after 3 clocks from the enable times of the chip select signal CS.

According to the embodiment described above with reference to FIGS. 4 to 7B, the volatile memory devices 410_0 and 410_1 share the control bus CMD/ADDR_BUS and the data bus DATA_BUS, but have different latencies with respect to the control bus CMD/ADDR_BUS. The controller 400 may access a volatile memory device which is desired to access, between the volatile memory devices 410_0 and 410_1, by changing the latency of signals applied through the control bus CMD/ADDR_BUS. Therefore, it is not necessary for an additional line to independently control the volatile memory devices 410_0 and 410_1.

While it was exemplified in the above embodiment that the volatile memory devices 410_0 and 410_1 are set by the controller 400 to have different latencies with respect to the control bus CMD/ADDR_BUS, this is for an illustration purpose only and the volatile memory devices 410_0 and 410_1 may be programmed to have permanently different latencies. For example, the latencies of the volatile memory devices 410_0 and 410_1 with respect to the control bus CMD/ADDR_BUS may be fixed when fabricating the volatile memory devices 410_0 and 410_1, or the latencies of the volatile memory devices 410_0 and 410_1 with respect to the control bus CMD/ADDR_BUS may be fixed through permanent setting for example, setting by using a fuse circuit, after fabrication of the volatile memory devices 410_0 and 410_1.

Figure 8:
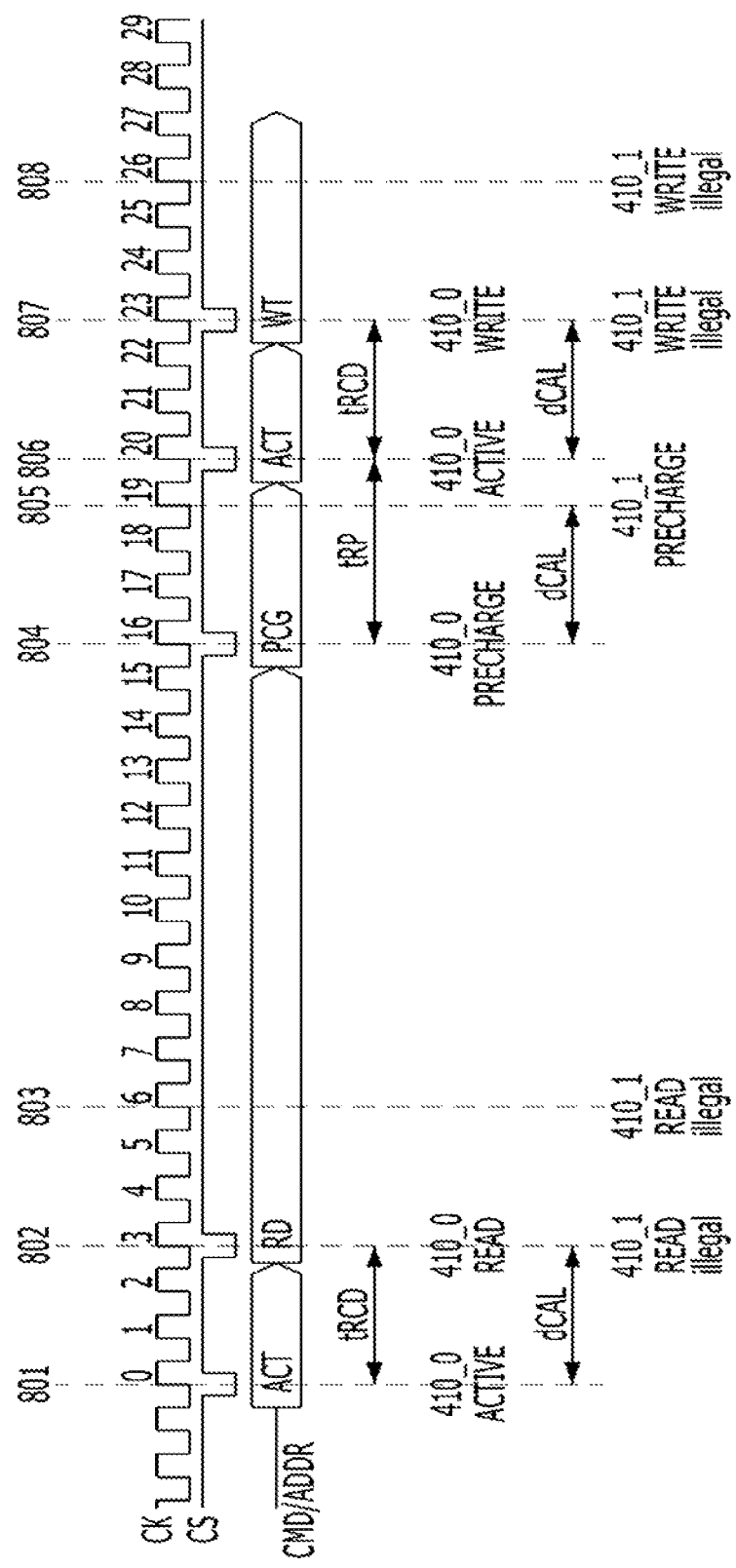
FIG. 8 is an example of a timing diagram to assist in the description of advantages when a difference dCAL in the values of command address latencies CAL of volatile memory devices 410_0 and 410_1 is equal to or greater than a tRCD and less than a tRP.

Here, the difference in command address latency CAL between the volatile memory devices 410_0 and 410_1 may be equal to or greater than a delay time tRCD (RAS to CAS delay) of a column address from a row address. Additionally, the difference in the values of command address latencies CAL between the volatile memory devices 410_0 and 410_1 may be less than a row precharge time tRP. That is, dCAL (CAL difference) tRCD, and dCAL<tRP. FIG. 8 is an example of a diagram to assist in the description of advantages when the difference dCAL in the values of command address latencies CAL of the volatile memory devices 410_0 and 410_1 is equal to or greater than the tRCD and less than the tRP. With reference to FIG. 8, descriptions will be made on the presumption that dCAL=3 as the first volatile memory device 410_0 has CAL=0 and the second volatile memory device 410_1 has CAL=3, tRCD=3 and tRP=4.

Referring to FIG. 8, at a point of time 801, the chip select signal CS may be enabled, and an active operation ACT may be instructed by the command/address CMD/ADDR. Then, the first volatile memory device 410_0 may perform an active operation by recognizing the active operation ACT at the point of time 801.

At a point of time 802, the chip select signal CS may be enabled, and a read operation RD may be instructed by the command/address CMD/ADDR. Then, the first volatile memory device 410_0 may perform a read operation by recognizing the read operation RD at the point of time 802. At the point of time 802 when 3 clocks pass after the chip select signal CS is enabled at the point of time 801, the second volatile memory device 410_1 may recognize the read operation RD from the command/address CMD/ADDR. However, since an active operation had not been performed in the second volatile memory device 410_1, the second volatile memory device 410_1 may determine the read operation RD instructed by the command/address CMD/ADDR, as illegal, and may not perform a read operation. If dCAL is smaller than tRCD, a mis-operation may occur as the second volatile memory device 410_1 recognizes the active operation ACT instructed to the first volatile memory device 410_0. Such a mis-operation may be prevented when dCAL≥tRCD. At a point of time 803 when 3 clocks pass after the chip select signal CS is enabled at the point of time 802, the second volatile memory device 410_1 may recognize the read operation RD from the command/address CMD/ADDR. However, since an active operation had not been performed in the second volatile memory device 410_1, the second volatile memory device 410_1 may determine the read operation RD instructed by the command/address CMD/ADDR, as illegal, and may not perform a read operation.

At a point of time 804, the chip select signal CS may be enabled, and a precharge operation PCG may be instructed by the command/address CMD/ADDR. Then, the first volatile memory device 410_0 may perform a precharge operation by recognizing the precharge operation PCG at the point of time 804. At a point of time 805 when 3 clocks pass after the chip select signal CS is enabled at the point of time 804, the second volatile memory device 410_1 may recognize the precharge operation PCG from the command/address CMD/ADDR and may perform a precharge operation. Since a precharge operation does not consider whether an active operation has previously been performed, the precharge operation may be performed even by the second volatile memory device 410_1.

At a point of time 806, the chip select signal CS may be enabled, and an active operation ACT may be instructed by the command/address CMD/ADDR. Then, the first volatile memory device 410_0 may perform an active operation by recognizing the active operation ACT at the point of time 806. If dCAL is set greater than tRP, a mis-operation may occur as the second volatile memory device 410_1 recognizes the active operation ACT instructed through the command/address CMD/ADDR and performs an active operation, from the point of time 806. Such a mis-operation may be prevented since dCAL<tRP.

At a point of time 807, the chip select signal CS may be enabled, and a write operation WT may be instructed by the command/address CMD/ADDR. Then, the first volatile memory device 410_0 may perform a write operation by recognizing the write operation WT at the point of time 807. At the point of time 807 when 3 clocks pass after the chip select signal CS is enabled at the point of time 806, the second volatile memory device 410_1 may recognize the write operation WT from the command/address CMD/ADDR. However, since an active operation had not been performed in the second volatile memory device 410_1, the second volatile memory device 410_1 may determine the write operation WT instructed by the command/address CMD/ADDR, as illegal, and may not perform a write operation. At a point of time 808 when 3 clocks pass after the chip select signal CS is enabled at the point of time 807, the second volatile memory device 410_1 may recognize the write operation WT from the command/address CMD/ADDR. However, the second volatile memory device 410_1 may determine the write operation WT instructed by the command/address CMD/ADDR, as illegal, and may not perform a write operation.

As described above with reference to FIG. 8, by setting the command address latencies CAL of the volatile memory devices 410_0 and 410_1 in such a way as to satisfy dCAL (CAL difference) tRCD and dCAL<tRP, it is possible to prevent the volatile memory devices 410_0 and 410_1 from performing mis-operations.

Configuration and Operation of Nonvolatile Dual in-Line Memory Module (NVDIMM)

Figure 9:
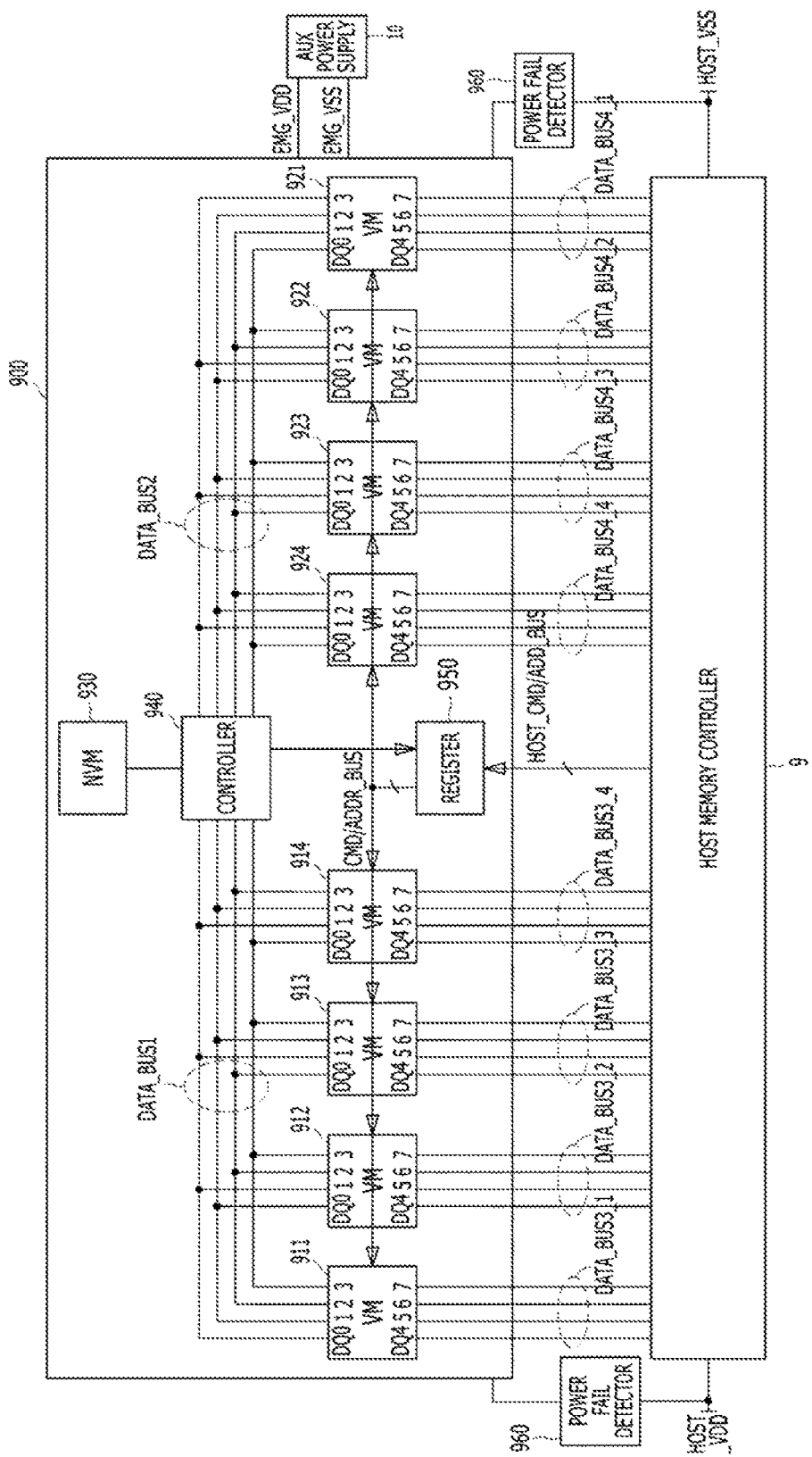
FIG. 9 is a configuration diagram illustrating an example of a nonvolatile dual in-line memory module (NVDIMM) in accordance with an embodiment.

FIG. 9 is a configuration diagram illustrating an example of the NVDIMM 900 in accordance with an embodiment. In FIG. 9, descriptions will be made for an example in which the scheme of setting different CAL of volatile memory devices and accessing independently the volatile memory devices sharing a data bus and a control bus, which is described above with reference to FIGS. 4 to 8, is applied to the NVDIMM 900 in accordance with the embodiment.

In FIG. 9, a memory controller 9 of a host and an auxiliary power supply 10 which construct an NVDIMM memory system are shown together. The NVDIMM 900 is a memory module which prevents data from being lost upon occurrence of a power fail, through an operation of backing up data of volatile memory devices in a nonvolatile memory device when power of the host is unstable.

Referring to FIG. 9, the NVDIMM 900 may include a first group of volatile memory devices 911 to 914, a second group of volatile memory devices 921 to 924, a nonvolatile memory device 930, a controller 940, a register 950, a power fail detector 960, a first data bus DATA_BUS1, a second data bus DATA_BUS2, a control bus CMD/ADDR_BUS, a plurality of third data buses DATA_BUS3_1 to DATA_BUS3_4, and a plurality of fourth data buses DATA_BUS4_1 to DATA_BUS4_4.

When power HOST_VDD and HOST_VSS of the host is normal, the register 950 may buffer a command, an address and a clock provided from the memory controller 9 of the host through a host control bus HOST_CMD/ADDR_BUS, and may provide the command, the address and the clock to first and second groups of volatile memory devices 911 to 914 and 921 to 924 through the control bus CMD/ADDR_BUS. When the power HOST_VDD and HOST_VSS of the host is normal, the first group of volatile memory devices 911 to 914 may transmit/receive data to/from the memory controller 9 of the host through the third data buses DATA_BUS3_1 to DATA_BUS3_4 respectively corresponding thereto, and the second group of volatile memory devices 921 to 924 may transmit/receive data to/from the memory controller 9 of the host through the fourth data buses DATA_BUS4_1 to DATA_BUS4_4 respectively corresponding thereto. That is, when the power HOST_VDD and HOST_VSS of the host is normal, first and second groups of volatile memory devices 911 to 914 and 921 to 924 may independently communicate with the memory controller 9 of the host through corresponding data buses among the third data buses DATA_BUS3_1 to DATA_BUS3_4 and the fourth data buses DATA_BUS4_1 to DATA_BUS4_4.

When the power fall detector 960 detects a fail in the power HOST_VDD and HOST_VSS of the host as levels of voltages forming the power HOST_VDD and HOST_VSS of the host become unstable, the supply of the power HOST_VDD and HOST_VSS of the host to the NVDIMM 900 is interrupted. Then, emergency power EMG_VDD and EMG_VSS of the auxiliary power supply 10 is supplied to the NVDIMM 900. The auxiliary power supply 10 may be realized through a large capacity capacitor, for example, a super capacitor, and may supply the emergency power EMG_VDD and EMG_VSS when the data of first and second groups of volatile memory devices 911 to 914 and 921 to 924 are backed up in the nonvolatile memory device 930. Although it is illustrated in FIG. 9 that the auxiliary power supply 10 is disposed outside the NVDIMM 900, the auxiliary power supply 10 may be disposed inside the NVDIMM 900. Furthermore, when a fail in the power HOST_VDD and HOST_VSS of the host is detected, the power fail detector 960 may notify the controller 940 of the fail.

When the fail in the power HOST_VDD and HOST_VSS of the host is notified from the power fail detector 960, control over first and second groups of volatile memory devices 911 to 914 and 921 to 924 is changed from the memory controller 9 of the host to the controller 940 of the NVDIMM 900. Then, the register 950 may buffer a command, an address and a clock provided from the controller 940, and may provide the command, the address and the clock to first and second groups of volatile memory devices 911 to 914 and 921 to 924 through the control bus CMD/ADDR_BUS. The first group of volatile memory devices 911 to 914 may exchange data with the controller 940 through the first data bus DATA_BUS1, and the second group of volatile memory devices 921 to 924 may exchange data with the controller 940 through the second data bus DATA_BUS2. The controller 940 may read the data of first and second groups of volatile memory devices 911 to 914 and 921 to 924 through the control bus CMD/ADDR_BUS, the first data bus DATA_BUS1 and the second data bus DATA_BUS2, and may store that is, back up the read data in the nonvolatile memory device 930.

The data of first and second groups of volatile memory devices 911 to 914 and 921 to 924 backed up in the nonvolatile memory device 930 upon occurrence of the fail in the power HOST_VDD and HOST_VSS of the host may be transmitted to and stored in first and second groups of volatile memory devices 911 to 914 and 921 to 924 after the power HOST_VDD and HOST_VSS of the host returns to a normal state. Such a restoration operation may be performed according to control of the controller 940, and, after restoration is completed, control over first and second groups of volatile memory devices 911 to 914 and 921 to 924 may be changed back from the controller 940 of the NVDIMM 900 to the memory controller 9 of the host.

The first group of volatile memory devices 911 to 914 share the same control bus CMD/ADDR_BUS and data bus DATA_BUS1 in communication with the controller 940. Similarly, the second group of volatile memory devices 921 to 924 share the same control bus CMD/ADDR_BUS and data bus DATA_BUS2 in communication with the controller 940. Nevertheless, the controller 940 may independently access an individual volatile memory device among the first group of volatile memory devices 911 to 914, and may independently access an individual volatile memory device among the second group of volatile memory devices 921 to 924. In this regard, descriptions are made above with reference to FIGS. 2 to 8 in connection with the configuration and the operation of the DIMM which shares the control bus CMD/ADDR_BUS and the data bus DATA_BUS. With regard to independent operations associated with data backup and restoration in an NVDIMM, descriptions will be made later with reference to FIGS. 11 and 12.

The first and second groups of volatile memory devices 911 to 914 and 921 to 924 may be DRAMs or may be not only DRAMs but also different types of volatile memory devices. For example, the nonvolatile memory device 930 may be a NAND flash. However, the nonvolatile memory device 930 is not limited to such, and may be any type of nonvolatile memory device, for example, a NOR flash, a resistive RAM (RRAM), a phase RAM (PRAM), a magnetic RAM (MRAM) or a spin transfer torque MRAM (STT-MRAM).

The components in the NVDIMM 900 shown in FIG. 9 may be incorporated with or separated from one another. For example, the controller 940, the register 950 and the power fail detector 960 may be configured through one chip or may be configured through a plurality of chips. Furthermore, the numbers of the first group of volatile memory devices 911 to 914, the second group of volatile memory devices 921 to 924 and the nonvolatile memory device 930 used in the NVDIMM 900 may be different from the illustration of FIG. 9.

Figure 10:
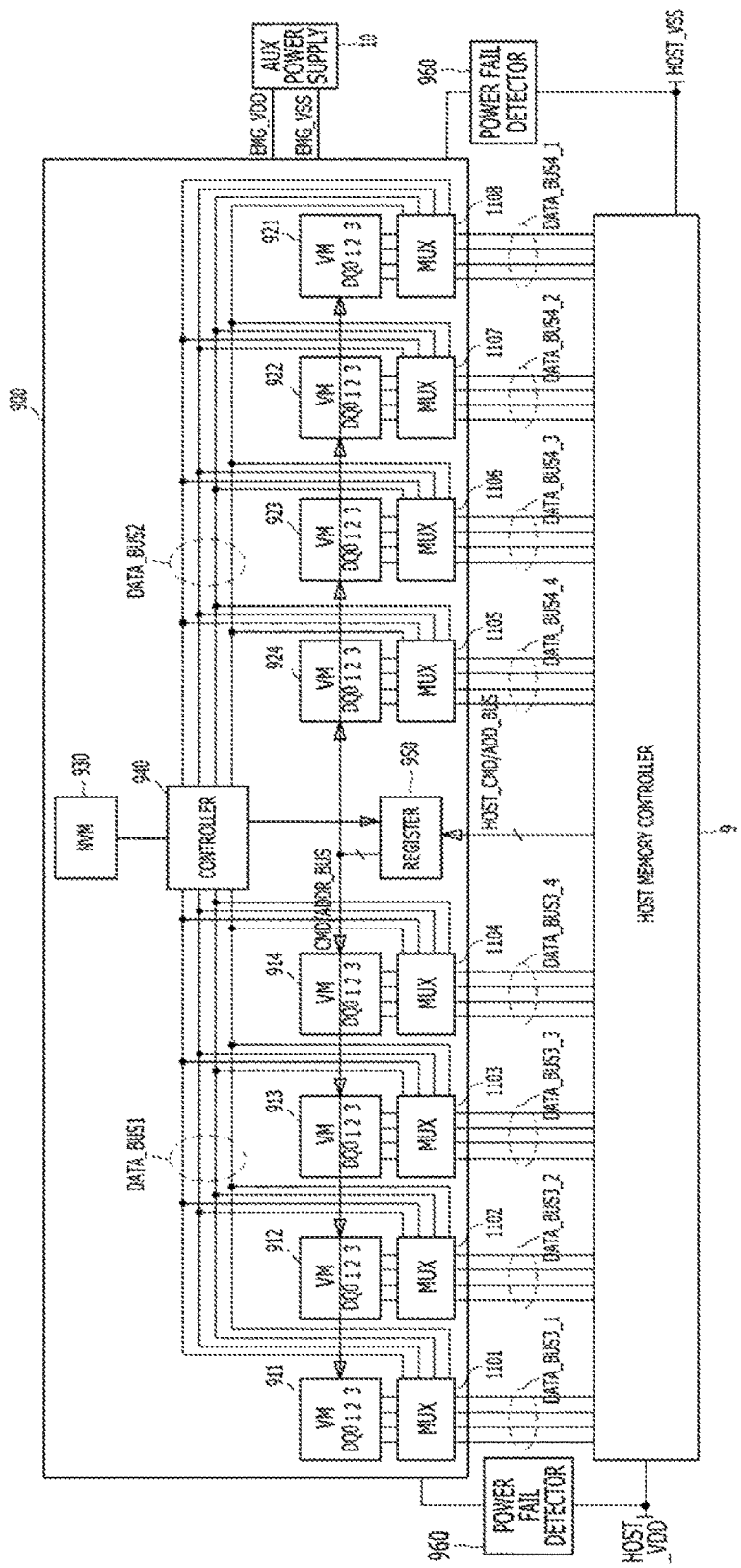
FIG. 10 is a configuration diagram illustrating an example of an NVDIMM in accordance with another embodiment.

FIG. 10 is a configuration diagram illustrating an example of the NVDIMM 900 in accordance with another embodiment.

The NVDIMMs 900 in FIGS. 9 and 10 may be the same as each other except for multiplexers 1101 to 1108 and 4 data pads DQ0 to DQ3

Through the multiplexers 1101 to 1104, the data pads DQ0 to DQ3 of the first group of volatile memory devices 911 to 914 and the third data buses DATA_BUS3_1 to DATA_BUS3_4 may be coupled when the first group of volatile memory devices 911 to 914 communicate with the memory controller 9 of the host, and the data pads DQ0 to DQ3 of the first group of volatile memory devices 911 to 914 and the first data bus DATA_BUS1 may be coupled when the first group of volatile memory devices 911 to 914 communicate with the controller 940.

Through the multiplexers 1105 to 1108, the data pads DQ0 to DQ3 of the second group of volatile memory devices 921 to 924 and the fourth data buses DATA_BUS4_1 to DATA_BUS4_4 may be coupled when the second group of volatile memory devices 921 to 924 communicate with the memory controller 9 of the host, and the data pads DQ0 to DQ3 of the second group of volatile memory devices 921 to 924 and the second data bus DATA_BUS2 may be coupled when the second group of volatile memory devices 921 to 924 communicate with the controller 940.

Since the NVDIMM 900 of FIG. 10 operates in the same manner as described above with reference to FIG. 9 except that the multiplexers 1101 to 1108 are added and the 4 data pads DQ0 to DQ3 are used in each of first and second groups of volatile memory devices 911 to 914 and 921 to 924, further detailed descriptions will be omitted herein.

Power-Down Backup Operation

Figure 11:
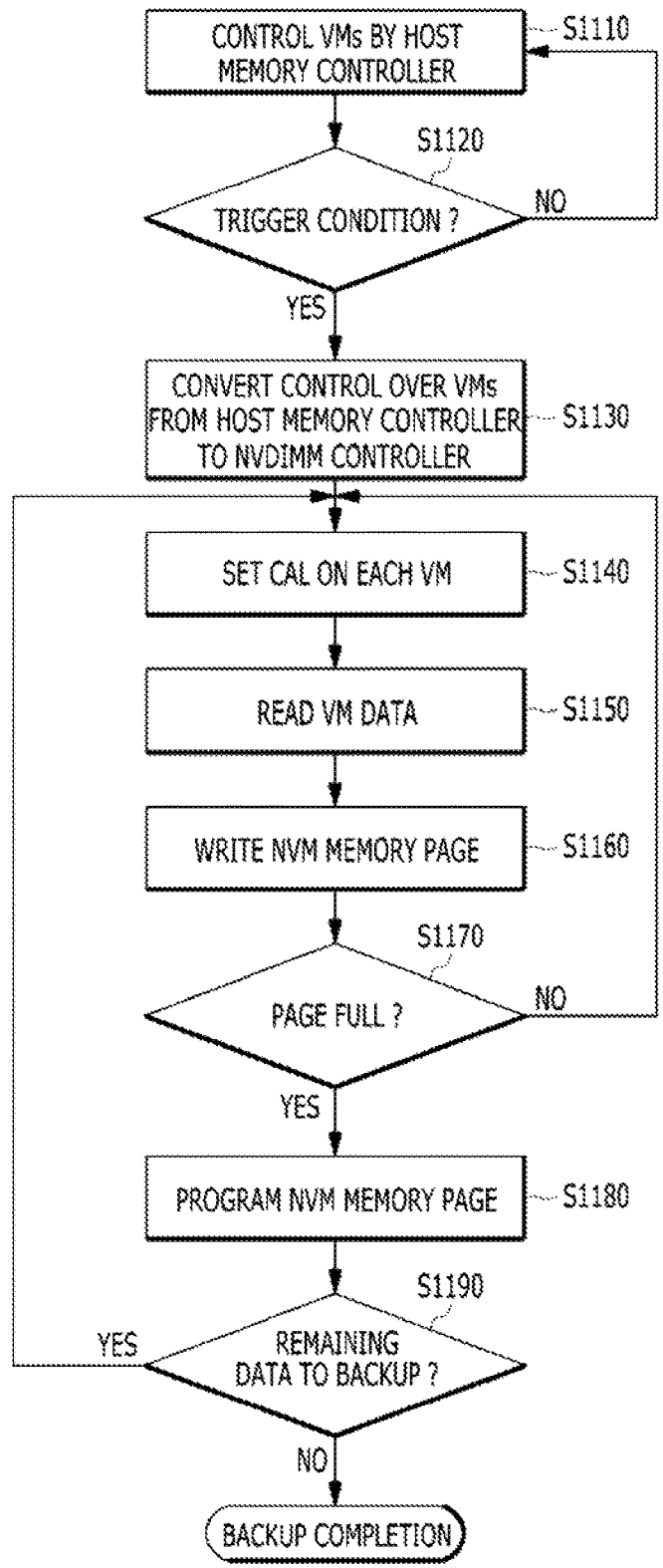
FIG. 11 is an example of a flow chart to assist in the description of a backup operation in the NVDIMM in accordance with the embodiment.

FIG. 11 is an example of a flow chart to assist in the description of a backup operation in the NVDIMM 900 in accordance with the embodiment.

At step S1110, first and second groups of volatile memory devices 911 to 914 and 921 to 924 communicate with the memory controller 9 of the host at a normal time, and control over the first and second groups of volatile memory devices 911 to 914 and 921 to 924 is performed by the memory controller 9 of the host in the NVDIMM 900 illustrated in FIG. 9. When first and second groups of volatile memory devices 911 to 914 and 921 to 924 share the same control bus CMD/ADDR_BUS, the data buses DATA_BUS3_1 to DATA_BUS3_4 and DATA_BUS4_1 to DATA_BUS4_4 are provided respectively for the first and second groups of volatile memory devices 911 to 914 and 921 to 924. Therefore, unlike the controller 940 of the NVDIMM 900, the memory controller 9 of the host may independently transmit/receive data to/from the first and second groups of volatile memory devices 911 to 914 and 921 to 924.

At step S1120, a determination is made for whether a trigger condition may be satisfied for backing up the data of first and second groups of volatile memory devices 911 to 914 and 921 to 924 in the nonvolatile memory device 930. For example, detection of a fail in the power HOST_VDD and HOST_VSS of the host may satisfy the trigger condition. Alternatively, when a backup operation is performed according to an instruction of the memory controller 9 of the host, the instruction of the memory controller 9 of the host for the backup operation may satisfy the trigger condition.

At step S1130, control over the first and second groups of volatile memory devices 911 to 914 and 921 to 924 may be changed from the memory controller 9 of the host to the controller 940 of the NVDIMM 900. Further, power to be used by the NVDIMM 900 is changed from the power HOST_VDD and HOST_VSS of the host to the emergency power EMG_VDD and EMG_VSS supplied by the auxiliary power supply 10. Moreover, as a control subject is changed to the controller 940, a data bus used by the first group of volatile memory devices 911 to 914 is changed from the third data buses DATA_BUS3_1 to DATA_BUS3_4 to the first data bus DATA_BUS1, and a data bus used by the second group of volatile memory devices 921 to 924 is changed from the fourth data buses DATA_BUS4_1 to DATA_BUS4_4 to the second data bus DATA_BUS2.

At step S1140, the controller 940 individually sets command address latencies CAL on the first and second groups of volatile memory devices 911 to 914 and 921 to 924 which share the control bus CMD/ADDR_BUS and the data buses DATA_BUS1 and DATA_BUS2.

Referring to FIG. 9, the respective first group of volatile memory devices 911 to 914 and the respective second group of volatile memory devices 921 to 924 include 8 data pads DQ0 to DQ7. Among the data pads DQ0 to DQ7, 4 data pads DQ0 to DQ3 may be coupled with the first data bus DATA_BUS1 and the second data bus DATA_BUS2, and 4 remaining data pads DQ4 to DQ7 may be coupled with the third data buses DATA_BUS3_1 to DATA_BUS3_4 and the fourth data buses DATA_BUS4_1 to DATA_BUS4_4. Data buses used by first and second groups of first and second groups of volatile memory devices 911 to 914 and 921 to 924 may be changed by the instruction of the controller 940. The zeroth data pads DQ0 of the first group of volatile memory devices 911 to 914 may be respectively coupled with different data lines of the first data bus DATA_BUS1, and the zeroth data pads DQ0 of the second group of volatile memory devices 921 to 924 may be respectively coupled with different data lines of the second data bus DATA_BUS2. Through this, the first group of volatile memory devices 911 to 914 may independently enter the PDA mode, and the second group of volatile memory devices 921 to 924 may independently enter the PDA mode.

For example, this may be achieved by setting the command address latency CAL of target volatile memory devices for example, volatile memory devices 911 and 921 of the respective first and second groups of the volatile memory devices 911 to 914 and 921 to 924 to a first value for example, 0, and by setting the command address latency CAL of the remaining ones other than the target volatile memory devices 911 and 921 of the respective first and second groups of the volatile memory devices 911 to 914 and 921 to 924 to a second value for example, 3.

At step S1150, the controller 940 reads the target volatile memory devices 911 and 921 of the respective first and second groups of volatile memory devices 911 to 914 and 921 to 924 by using the set command address latency CAL. For example, the controller 400 may read the target volatile memory devices 911 and 921 of the respective first and second groups of volatile memory devices 911 to 914 and 921 to 924 by accessing the target volatile memory devices 911 and 921 of the respective first and second groups of volatile memory devices 911 to 914 and 921 to 924 of which command address latency CAL is set to the first value for example, 0, through applying the command/address CMD/ADDR at the enable time of the chip select signal CS. Since the remaining volatile memory devices 912 to 914 and 922 to 924 other than the target volatile memory devices 911 and 921 of the respective first and second groups of volatile memory devices 911 to 914 and 921 to 924 are set to the second value for example, 3, in the command address latency CAL thereof, the remaining volatile memory devices 912 to 914 and 922 to 924 neglect the read command from the controller 940.

The scheme of step S1140 that the controller 940 sets command address latencies CAL independently on the first and second groups of volatile memory devices 911 to 914 and 921 to 924 which share the control bus CMD/ADDR_BUS and the data buses DATA_BUS1 and DATA_BUS2, and the scheme of step S1150 that the controller 940 reads data by accessing the target volatile memory devices 911 and 921 of the respective first and second groups of volatile memory devices 911 to 914 and 921 to 924 which has a specified command address latency CAL may be understood from the descriptions made above with reference to FIGS. 4 to 7B. Further, as aforementioned above, the difference dCAL between the first value and the second value of the command address latencies CAL may be set in such a way as to satisfy dCAL≥tRCD and dCAL<tRP.

At step S1160, a data backup operation is performed as the data read from volatile memory devices are written in the nonvolatile memory device 930. For example, the data read from the target volatile memory devices 911 and 921 of the respective first and second groups of volatile memory devices 911 to 914 and 921 to 924 may be backed up in a page of the nonvolatile memory device 930.

At step S1170, a determination is made for whether the nonvolatile memory page is full (i.e. data write is completed for the page). If the nonvolatile memory page is not full, the process may return to the step S1140.

For example, when data stored in the target volatile memory devices 911 and 921 of the respective first and second groups of volatile memory devices 911 to 914 and 921 to 924 remains, the controller 940 may perform the read operation for the remaining data stored in the target volatile memory devices 911 and 921 of the respective first and second groups of volatile memory devices 911 to 914 and 921 to 924 by setting the command address latency CAL of the target volatile memory devices 911 and 921 of the respective first and second groups of volatile memory devices 911 to 914 and 921 to 924 to the first value for example, 0 and by setting the command address latency CAL of the remaining volatile memory devices 912 to 914 and 922 to 924 other than the target volatile memory devices 911 and 921 to the second value for example, 3, at step S1140.

For another example, when all the data stored in the target volatile memory devices 911 and 921 of the respective first and second groups of volatile memory devices 911 to 914 and 921 to 924 are backed up, the controller 940 at step S1140 may set the command address latency CAL of another target volatile memory devices for example, the volatile memory devices 912 and 922 of the respective first and second groups of volatile memory devices 911 to 914 and 921 to 924 to the first value for example, 0 and may set the command address latency CAL of the remaining volatile memory devices 911, 913, 914, 921, 923 and 924 other than the target volatile memory devices 912 and 922 to the second value for example, 3. Then, at step S1150, the controller 940 may read the target volatile memory devices 912 and 922 through the setting of the command address latency CAL. Although not illustrated, the selective reading of the first and second groups of volatile memory devices 911 to 914 and 921 to 924 which share the control bus CMD/ADDR_BUS and the data buses DATA_BUS1 and DATA_BUS2, through the setting of the command address latency CAL, may be performed to all of the respective first and second groups of volatile memory devices 911 to 914 and 921 to 924 by individually selecting as the target volatile memory device each volatile memory device in the respective first and second groups of volatile memory devices 911 to 914 and 921 to 924.

When it is determined at step S1170 that the nonvolatile memory page is full, the process proceeds to step S1180 where the nonvolatile memory page is programmed.

When programming the memory page of the nonvolatile memory device 930, it is necessary to check whether data not read from the first and second groups of volatile memory devices 911 to 914 and 921 to 924 still exists. Thus, during the program operation to the memory page of the nonvolatile memory device 930 of step S1180, the controller 940 may perform a refresh operation for the first and second groups of volatile memory devices 911 to 914 and 921 to 924. For example, a distributed refresh operation of uniformly distributed refresh cycles may be performed to the first and second groups of volatile memory devices 911 to 914 and 921 to 924 such that all rows are turned on before iterating a task and data is read when a refresh is not performed in the respective first and second groups of volatile memory devices 911 to 914 and 921 to 924.

When a new nonvolatile memory page is prepared and written, the first and second groups of volatile memory devices 911 to 914 and 921 to 924 may operate under a low power mode, in which the first and second groups of volatile memory devices 911 to 914 and 921 to 924 use a lower power than in a normal power mode. After the new nonvolatile memory page is prepared and written, when data to back up still remains in the first and second groups of volatile memory devices 911 to 914 and 921 to 924 and a memory page to program exists in the nonvolatile memory device 930, the first and second groups of volatile memory devices 911 to 914 and 921 to 924 are recovered to the normal power mode such that the operation of reading data to be backed up is performed continuously.

At step S1190, a determination is made for whether data to be backed up remains in the first and second groups of volatile memory devices 911 to 914 and 921 to 924. When data to be backed up does not remain, the power-down backup operation may end, and the NVDIMM 900 may be shut down. When data to be backed up remains, the process may proceed to the step S1140, and the backup operation for the remaining data is performed.

Power-Up Restoration Operation

Figure 12:
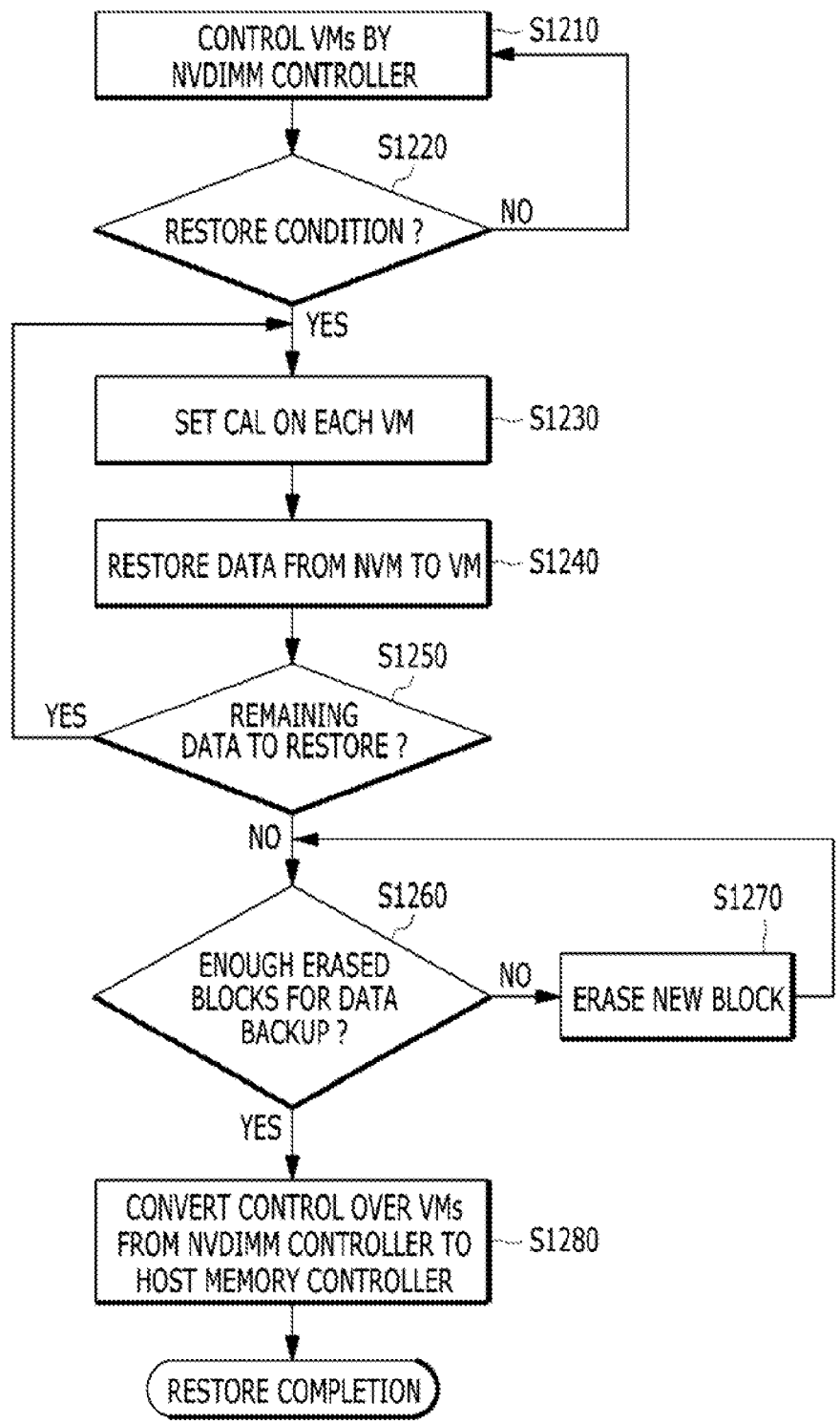
FIG. 12 is an example of a flow chart to assist in the description of a restoration operation in the NVDIMM in accordance with the embodiment.

FIG. 12 is an example of a flow chart to assist in the description of a restoration operation in the NVDIMM 900 in accordance with the embodiment.

A power-up restoration operation may be performed when the power HOST_VDD and HOST_VSS of the host returns to the normal state or as the memory controller 9 of the host instructs a restoration operation. Since the power HOST_VDD and HOST_VSS of the host has returned to the normal state, the power-up restoration operation may be performed through the power HOST_VDD and HOST_VSS of the host.

In an example, the NVDIMM 900 may perform the restoration operation in the state in which the NVDIMM 900 is shut down after completing the backup operation described above with reference to FIG. 11. In another example, in the course of the backup operation, the power HOST_VDD and HOST_VSS of the host may return to the normal state. In this case, the power-down backup operation may be interrupted, and the power-up restoration operation may be performed. In either example, first and second groups of volatile memory devices 911 to 914 and 921 to 924 of the NVDIMM 900 may be under the control of the controller 940 of the NVDIMM 900 at step S1210.

At step S1220, a determination is made for whether a restoration condition is satisfied, and, if the restoration condition is satisfied, restoration of data from the nonvolatile memory device 930 to the first and second groups of volatile memory devices 911 to 914 and 921 to 924 is started.

At step S1230, the controller 940 individually sets command address latencies CAL on the first and second groups of volatile memory devices 911 to 914 and 921 to 924 which share the control bus CMD/ADDR_BUS and the data buses DATA_BUS1 and DATA_BUS2. As described above for the backup operation with reference to FIG. 11, the first group of volatile memory devices 911 to 914 may independently enter the PDA mode, and the second group of volatile memory devices 921 to 924 may independently enter the PDA mode.

For example, the command address latency CAL of the target volatile memory devices 911 and 921 of the respective first and second groups of volatile memory devices 911 to 914 and 921 to 924 may be set to a third value for example, 0, and the command address latency CAL of the remaining volatile memory devices 912 to 914 and 922 to 924 other than the target volatile memory devices 911 and 921 may be set to a fourth value for example, 3.

At step S1240, data restoration to the target volatile memory devices 911 and 921 of the respective first and second groups of volatile memory devices 911 to 914 and 921 to 924 may be performed by writing the data read from the nonvolatile memory device 930 into the target volatile memory devices 911 and 921 of the respective first and second groups of volatile memory devices 911 to 914 and 921 to 924 through the command address latency CAL.

At step S1250, determination is made for whether data to restore remains in the nonvolatile memory device 930. If data to restore remains, the process may proceed to the step S1230, and the restoration operation may be performed for the remaining data.

For example, if data restoration for the target volatile memory devices 911 and 921 of the respective first and second groups of volatile memory devices 911 to 914 and 921 to 924 is completed, the controller 940 at step S1230 may set the command address latency CAL of another target volatile memory devices such as, the volatile memory devices 912 and 922 of the respective first and second groups of volatile memory devices 911 to 914 and 921 to 924) to the third value for example, 0 and may set the command address latency CAL of the remaining volatile memory devices 911, 913, 914, 921, 923 and 924 other than the target volatile memory devices 912 and 922 to the fourth value for example, 3. Then, at step S1240, the controller 940 may restore the data read from the nonvolatile memory device 930 to the target volatile memory devices 912 and 922 through the setting of the command address latency CAL. The data restoration operation may be performed for all of the respective first and second groups of volatile memory devices 911 to 914 and 921 to 924 by individually setting the command address latency CAL of each volatile memory device as the target volatile memory device in the respective first and second groups of volatile memory devices 911 to 914 and 921 to 924, setting the command address latency CAL of the remaining volatile memory devices other than the target volatile memory device in the respective first and second groups of volatile memory devices 911 to 914 and 921 to 924 to the fourth value, and then restoring the data read from the nonvolatile memory device 930 into the target volatile memory device. The difference dCAL between the third value and the fourth value of the command address latency CAL may be set in such a way as to satisfy dCAL≥tRCD and dCAL<tRP.

When it is determined at the step S1250 that data to restore does not remain, to prepare for when the power HOST_VDD and HOST_VSS of the host is down again, it is necessary to secure sufficient storage capacity of the nonvolatile memory device 930 to back up the data stored in the first and second groups of volatile memory devices 911 to 914 and 921 to 924 before control over the first and second groups of volatile memory devices 911 to 914 and 921 to 924 is changed to the memory controller 9 of the host.

Thus, at step S1260, a determination is made for whether erased or empty blocks are sufficient for the data backup in the nonvolatile memory device 930. For example, a determination is made for whether an amount of the erased blocks is sufficient to cover the entire capacity of the first and second groups of volatile memory devices 911 to 914 and 921 to 924 or the used amount or the valid range of data currently stored in the first and second groups of volatile memory devices 911 to 914 and 921 to 924 of the nonvolatile memory device 930. When sufficient erased blocks do not exist in the nonvolatile memory device 930, a new block is erased in the nonvolatile memory device 930 at step S1270.

If sufficient erased blocks exist in the nonvolatile memory device 930, control over the first and second groups of volatile memory devices 911 to 914 and 921 to 924 is changed from the controller 940 of the NVDIMM 900 to the memory controller 9 of the host at step S1280, and the power-up restoration operation is completed.

Thereafter, the NVDIMM 900 may be used by the memory controller 9 of the host, and may operate in the same state as at step S1110 described above with reference to FIG. 11. For example, a data bus for the first group of volatile memory devices 911 to 914 may be changed from the first data bus DATA_BUS1 to the third data buses DATA_BUS3_1 to DATA_BUS3_4, and a data bus for the second group of volatile memory devices 921 to 924 may be changed from the second data bus DATA_BUS2 to the fourth data buses DATA_BUS4_1 to DATA_BUS4_4.

As is apparent from the above descriptions, when the NVDIMM 900 performs backup and restoration operations of data by a fail and a recovery of the power HOST_VDD and HOST_VSS of the host, the first group of volatile memory devices 911 to 914 of the NVDIMM 900 shares the control bus CMD/ADDR_BUS and the first data bus DATA_BUS1 in communication with the controller 940, and the second group of volatile memory devices 921 to 924 of the NVDIMM 900 shares the control bus CMD/ADDR_BUS and the second data bus DATA_BUS2 in communication with the controller 940. The controller 940 may back up and restore data by accessing independently the first group of volatile memory devices 911 to 914 through setting command address latencies CAL to different values. Similarly, the controller 940 may back up and restore data by accessing independently the second group of volatile memory devices 921 to 924 through setting command address latencies CAL to different values.

In one or more exemplary embodiments, the functions described herein may be realized in hardware, software, firmware or any combination thereof. If realized in software, the functions may be stored or transmitted as one or more instructions or codes on a machine-readable medium, that is, a computer program product such as a computer-readable medium. The computer-readable medium includes a communication medium including a computer storage medium and any medium that facilitates transfer of a computer program from a place to another place. A storage medium may be any usable medium that may be accessed by a computer. In a non-limiting example, such a computer-readable medium may be accessed by a RAM, a ROM, an EEPROM, a CD-ROM, an optical disk memory device, a magnetic disk memory device, a magnetic storage device or a computer, and may include any medium that may be used in carrying or storing desired program codes in the form of instructions or data structures. The disk and the disc as used herein include a compact disc (CD), a laser disc, an optical disc, a digital versatile disc (DVD), a floppy disk and a blue-ray disc, where the disk usually reproduces data magnetically but the disc reproduces data optically. Even any combination thereof should be included within the scope of a computer-readable medium.

Although various embodiments have been described for illustrative purposes, it will be apparent to those skilled in the art that various changes and modifications may be made without departing from the spirit and scope of the invention as defined in the following claims.

What is claimed is:
1. A nonvolatile memory module comprising:
   a plurality of volatile memory devices suitable for sharing
      a data bus through which data is transmitted and a
      control bus through which a command and an address
      are transmitted;

at least one nonvolatile memory device; and
a controller including a backup logic which backs up data stored in the plurality of volatile memory devices when a fail in power of the host is detected or a backup operation is instructed from the memory controller of the host,
wherein the backup logic sets a command address latency (CAL) of one among the plurality of volatile memory devices to a first value, and sets a command address latency of remaining volatile memory devices to a second value different from the first value,
wherein the backup logic comprises:
a logic suitable for performing a distributed refresh operation for uniformly distributing a refresh cycle over the plurality of volatile memory devices when programming a memory page of the nonvolatile memory device;
a logic suitable for operating the plurality of volatile memory devices under a low power mode, in which the plurality of volatile memory devices use a lower power than in a normal power mode, when a new memory page of the nonvolatile memory device is prepared and written; and
a logic suitable for recovering the plurality of volatile memory devices to the normal power mode after the new memory page of the nonvolatile memory device is written.

2. The nonvolatile memory module according to claim 1, wherein the second value is greater than the first value, and a difference between the second value and the first value is equal to or greater than a row address to column address delay time (tRCD: RAS to CAS delay).

3. The nonvolatile memory module according to claim 2, wherein the difference between the second value and the first value is less than a row precharge time (tRP).

4. The nonvolatile memory module according to claim 1, wherein the controller further includes a restoration logic suitable for restoring data backed up in the nonvolatile memory device to the plurality of volatile memory devices when the power of the host is recovered to a normal state, and
wherein the restoration logic sets a command address latency (CAL) of one among the plurality of volatile memory devices to a third value, and sets a command address latency of remaining volatile memory devices to a fourth value different from the third value.

5. The nonvolatile memory module according to claim 4, wherein the fourth value is greater than the third value, and a difference between the fourth value and the third value is equal to or greater than a row address to column address delay time (tRCD: RAS to CAS delay).

6. The nonvolatile memory module according to claim 5, wherein the difference between the fourth value and the third value is less than a row precharge time (tRP).

7. The nonvolatile memory module according to claim 4, wherein the restoration logic comprises:
a logic suitable for determining whether a sufficient amount of erased blocks for data backup exist in the nonvolatile memory device after data restoration from the nonvolatile memory device to the plurality of volatile memory devices is completed;
a logic suitable for erasing a new block when the sufficient amount of erased bocks for data backup do not exist in the nonvolatile memory device; and
a logic suitable for changing control over the plurality of volatile memory devices from the controller to the memory controller of the host when the sufficient amount of erased bocks for data backup exist in the nonvolatile memory device.

8. The nonvolatile memory module according to claim 5, wherein the restoration logic comprises:
a logic suitable for determining whether a sufficient amount of erased blocks for data backup exist in the nonvolatile memory device after data restoration from the nonvolatile memory device to the plurality of volatile memory devices is completed;
a logic suitable for erasing a new block when the sufficient amount of erased bocks for data backup do not exist in the nonvolatile memory device; and
a logic suitable for changing control over the plurality of volatile memory devices from the controller to the memory controller of the host when the sufficient amount of erased bocks for data backup exist in the nonvolatile memory device.

9. The nonvolatile memory module according to claim 6, wherein the restoration logic comprises:
a logic suitable for determining whether a sufficient amount of erased blocks for data backup exist in the nonvolatile memory device after data restoration from the nonvolatile memory device to the plurality of volatile memory devices is completed;
a logic suitable for erasing a new block when the sufficient amount of erased bocks for data backup do not exist in the nonvolatile memory device; and
a logic suitable for changing control over the plurality of volatile memory devices from the controller to the memory controller of the host when the sufficient amount of erased bocks for data backup exist in the nonvolatile memory device.

10. A method for operating a nonvolatile memory module including a plurality of volatile memory devices which share a data bus through which data is transmitted and a control bus through which a command and an address are transmitted, a nonvolatile memory device, and a controller, the method comprising:
controlling, by a memory controller of a host, the plurality of volatile memory devices;
detecting a fail in power of the host or receiving an instruction for a backup operation from the memory controller of the host;
changing control over the plurality of volatile memory devices from the memory controller of the host to the controller;
setting, by the controller, a command address latency (CAL) of one among the plurality of volatile memory devices to a first value, and setting, by the controller, a command address latency of remaining volatile memory devices to a second value different from the first value;
reading the volatile memory device of the command address latency of the first value; and
backing up the read data in the nonvolatile memory device,
wherein the backing up of the read data comprises:
performing a distributed refresh operation for uniformly distributing a refresh cycle over the plurality of volatile memory devices when programming a memory page of the nonvolatile memory device;
operating the plurality of volatile memory devices under a low power mode, in which the plurality of volatile memory devices use a lower power than in a normal power mode, when a new memory page of the nonvolatile memory device is prepared and written; and recovering the plurality of volatile memory devices to the normal power mode after the new memory page of the nonvolatile memory device is written.

11. The method according to claim 10, wherein the second value is greater than the first value, and a difference between the second value and the first value is equal to or greater than a row address to column address delay time (tRCD: RAS to CAS delay).

12. The method according to claim 11, wherein the difference between the second value and the first value is less than a row precharge time (tRP).

13. The method according to claim 10, further comprising:
  detecting a recovery in the power of the host or receiving an instruction for a restoration operation from the memory controller of the host;
  setting, by the controller, a command address latency (CAL) of one among the plurality of volatile memory devices to a third value, and setting, by the controller, a command address latency of remaining volatile memory devices to a fourth value different from the third value;
  reading data backed up in the nonvolatile memory device, and restoring the read data in the volatile memory device of the command address latency of the third value; and
  iterating the setting of the CAL to the third and fourth values and the reading and restoring when data to be restored remains in the nonvolatile memory device.

14. The method according to claim 13, wherein the fourth value is greater than the third value, and a difference between the fourth value and the third value is equal to or greater than a row address to column address delay time (tRCD: RAS to CAS delay).

15. The method according to claim 14, wherein the difference between the fourth value and the third value is less than a row precharge time (tRP).

16. The method according to claim 13, further comprising:
  determining whether a sufficient amount of erased blocks for data backup exist in the nonvolatile memory device;
  erasing a new block when the sufficient amount of erased bocks for data backup do not exist in the nonvolatile memory device; and
  changing control over the plurality of volatile memory devices from the controller to the memory controller of the host when the sufficient amount of erased bocks for data backup exist in the nonvolatile memory device.

* * * * *